United States Patent [19]

Sato et al.

[11] Patent Number: 5,483,065
[45] Date of Patent: Jan. 9, 1996

[54] ELECTRON BEAM MICROANALYZER

[75] Inventors: Masao Sato; Yukio Takeuchi, both of Chiba, Japan

[73] Assignee: Seiko Instruments Inc., Chiba, Japan

[21] Appl. No.: 321,676

[22] Filed: Oct. 12, 1994

[30] Foreign Application Priority Data

Oct. 12, 1993 [JP] Japan ................................. 5-254483

[51] Int. Cl.[6] ................................................ H01J 37/252
[52] U.S. Cl. ............................................................ 250/310
[58] Field of Search ............................................. 250/310

[56] References Cited

U.S. PATENT DOCUMENTS 3,209,146  9/1965  Shirai ................................ 250/310
4,440,475  4/1984  Colliaux ............................ 250/310
4,978,855  12/1990 Liebl et al. ....................... 250/310
5,192,866  3/1993  Komi ................................ 250/310

Primary Examiner—Jack I. Berman
Attorney, Agent, or Firm—Loeb and Loeb

[57] ABSTRACT

In an electron beam microanalyzer which has an electron beam irradiation system for irradiating a surface of a sample in a chamber an with electron beam and an optical microscope capable of observing the sample, an electron beam deflecting coil is provided. The beam is emitted by the electron beam irradiation system in a direction oblique to the sample surface and the electron beam deflecting coil bends the electron beam to align the electron beam to the optical axis of the optical microscope, the optical axis being perpendicular to the sample surface.

6 Claims, 3 Drawing Sheets

ELECTRON BEAM MICROANALYZER

BACKGROUND OF THE INVENTION

The present invention relates to an electron beam microanalyzer having improved analytic performance and simplified structure compared with the most relevant prior art.

Conventionally, as shown in FIG. 2A, an optical reflecting mirror 212 and an optical objective lens 213 are arranged within an objective lens 211 provided in an electron beam irradiation system having a vertical optical axis. At the center of the optical objective lens 213, there is provided a capillary 214 for preventing glass from taking a charge due to the electron beam. An incident light 215 emitted from a light source passes through a semireflecting mirror 216, and then is deflected by 90° by the optical reflecting mirror 212 to irradiate, through the optical objective lens 213, a surface of an object 217 to be measured.

Simultaneously, an optical system is mechanically adjusted to so that the irradiated point on the surface of measured object 217 is disposed at the center of an optical image. In this example, alignment of the electron beam axis and the optical axis requires mechanical adjustment, which is troublesome. Since a hole is provided in optical lens 213, the brightness of an image of a sample is low and resolution is deteriorated. Lack of uniformity in brightness of the image and viewing defects occur at low magnification. Further, the conventional device has a complicated structure, is troublesome to install, and is costly.

When an electron beam irradiation system and an optical microscope have their axes oriented vertically to a sample and offset laterally from one another, as shown in FIG. 2B, it is impossible to observe the electron beam axis and the optical axis simultaneously, therefore confirming alignment of the two axes is difficult. Further, the conventional device requires good movement resolution of a stage which can move with a sample loaded thereon in a sample chamber, and also needs to store the image obtained by the optical microscope, which results in high cost.

In the conventional device, when either the electron beam irradiation system or the optical microscope is simply obliquely incident on the sample, if a surface of the sample is uneven or the operation distance changes, the electron beam axis and the optical axis do not coincide on the surface of the measured subject 17 as shown in FIG. 2C. Therefore, the shape and size of a sample which can be observed are limited and the device can not be used as a general purpose device.

Such a conventional electron beam microanalyzer has problems due to the complicated structure mentioned above, deterioration in resolution, viewing defects and high cost.

SUMMARY OF THE INVENTION

An object of the present invention is to eliminate such conventional problems by providing an electron beam microanalyzer whose analytic performance is improved and whose structure is simplified by using an electron beam deflecting coil for aligning the optical axis of the optical microscope which are put up vertically to and above the sample surface and the electron beam axis obliquely incident to the optical axis.

In order to solve the above problems, the present invention uses an electron beam deflecting coil, in an electron beam microanalyzer which has an electron beam irradiation system for irradiating an electron beam and an optical microscope capable of observing a sample in a vacuum chamber, thereby providing an adjustment means for aligning an optical axis and an electron beam axis. In the microanalyzer according to the invention, the optical microscope has an optical axis oriented preferably at right angles to the sample surface in the vacuum chamber for observing the sample, the electron beam irradiation system has an axis oriented obliquely to the sample surface in the vacuum chamber to irradiate the sample surface with an electron beam, and the deflecting coil which is provided in the vacuum chamber deflects the electron beam along an axis aligned, and preferably substantially coincident, with the optical axis.

In the electron beam microanalyzer having the above-described structure, the electron beam irradiation system and the optical microscope are each assembled independently, and also the electron beam deflecting coil is adjusted while the electron beam axis and the optical axis are simultaneously observed, thereby enabling the electron beam axis and the optical axis to be aligned. Therefore, optical lenses are necessitated among objective lenses provided in the electron beam irradiation system, and the structure is extremely simple, so that resolution is not deteriorated. The electron beam axis is easily electrically adjusted by varying the amount of electric current flowing through the deflecting coil, so that the two axes can be easily aligned, and preferably made coincident, without fail.

DESCRIPTION OF THE PREFERRED EMBODIMENTS

Hereinafter, embodiments of the present invention will be described with reference to the drawings.

Figure 1:
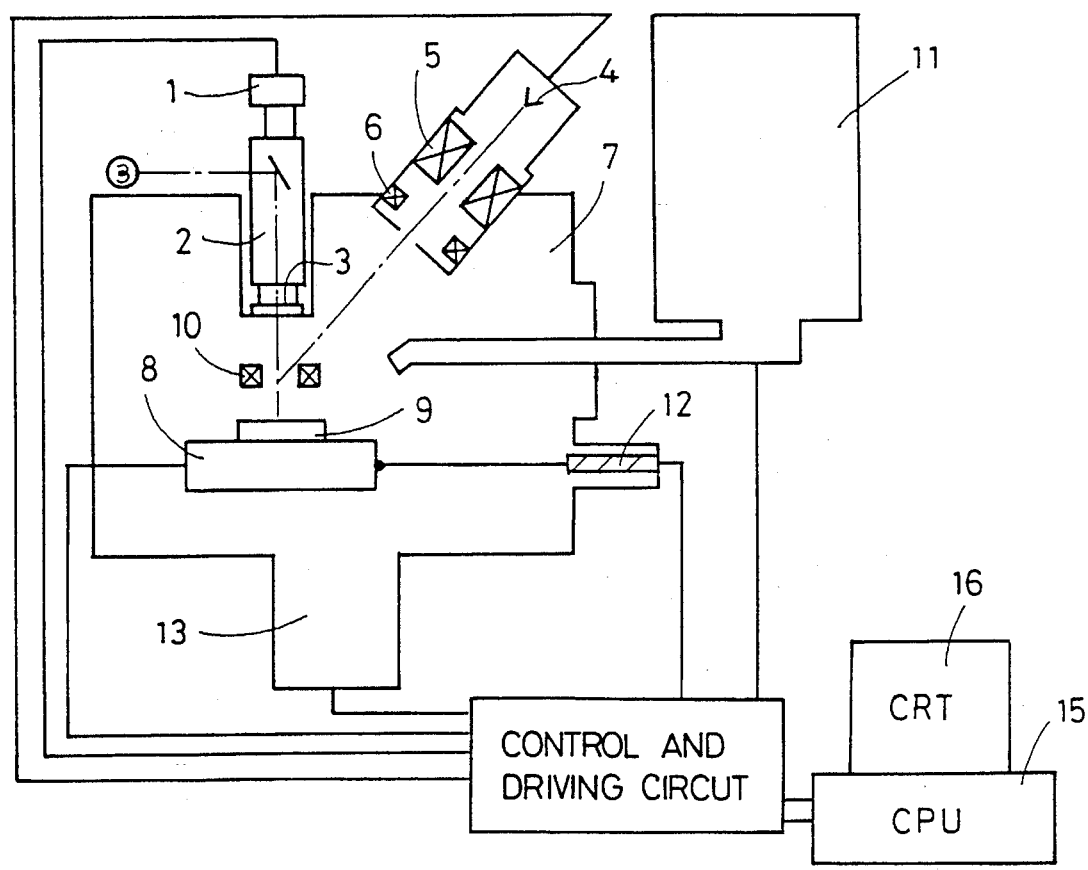
FIG. 1 is a pictorial view of the electron beam microanalyzer according to an embodiment of the present invention.
Figure 2A:
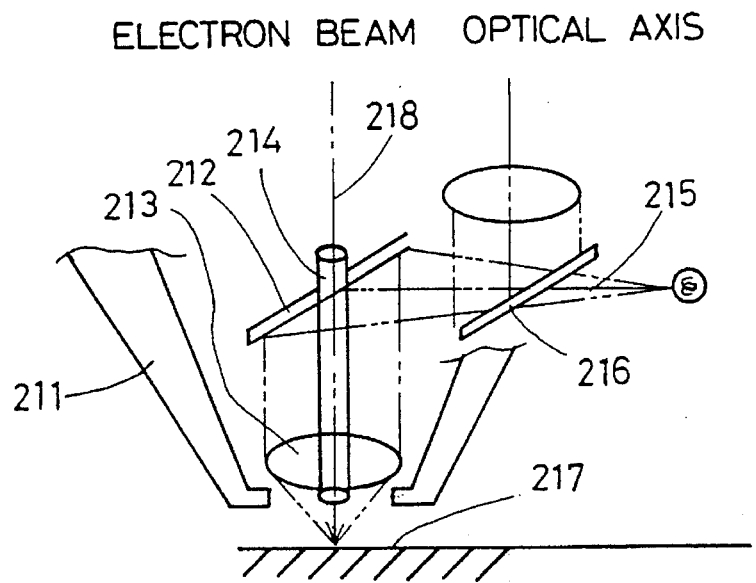
FIGS. 2A, 2B and 2C are pictorial views showing the conditions in a conventional electron beam microanalyzer.
Figure 2B:
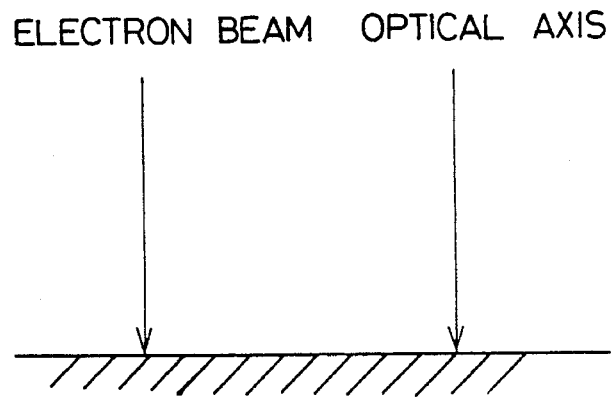
Figure 2C:
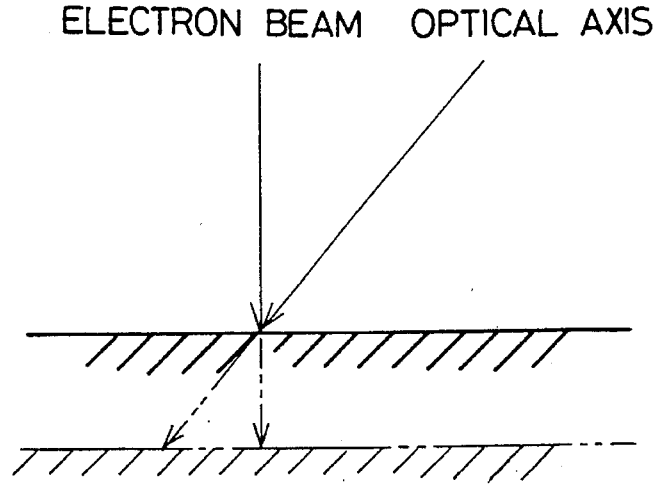

FIG. 1 shows the general structure of an electron beam microanalyzer according to an embodiment of the present invention. The microanalyzer includes an optical microscope having a CCD camera 1, a zoom lens 2, and an objective lens 3. The microanalyzer further includes an electron beam irradiation system having an electron gun 4, an electron lens 5, and an alignment coil 6. The optical microscope and the electron beam irradiation system are attached to a vacuum sample chamber 7. Inside of the vacuum chamber 7, there is provided a sample stage 8 which can move in three orthoganol axial directions along an x-axis, a y-axis, and a z-axis, and a sample 9 is mounted on sample stage 8.

A deflecting coil 10 for bending the axis of the electron beam and aligning it with the optical axis of the optical microscope is provided above sample stage 8 and between the optical microscope and sample 9.

An energy dispersion type x-ray detection unit 11 is mounted adjacent vacuum chamber 7 and has an input end extending into chamber 7. A stage driving device 12 and a chamber evacuation system 13 are installed in chamber 7. A control and driving circuit 14 controls and drives the entire system. A CPU 15 is connected to circuit 14 to control operation of the system and a CRT 16 is connected to CPU 15 to display optical images and analytic results.

Figure 3:
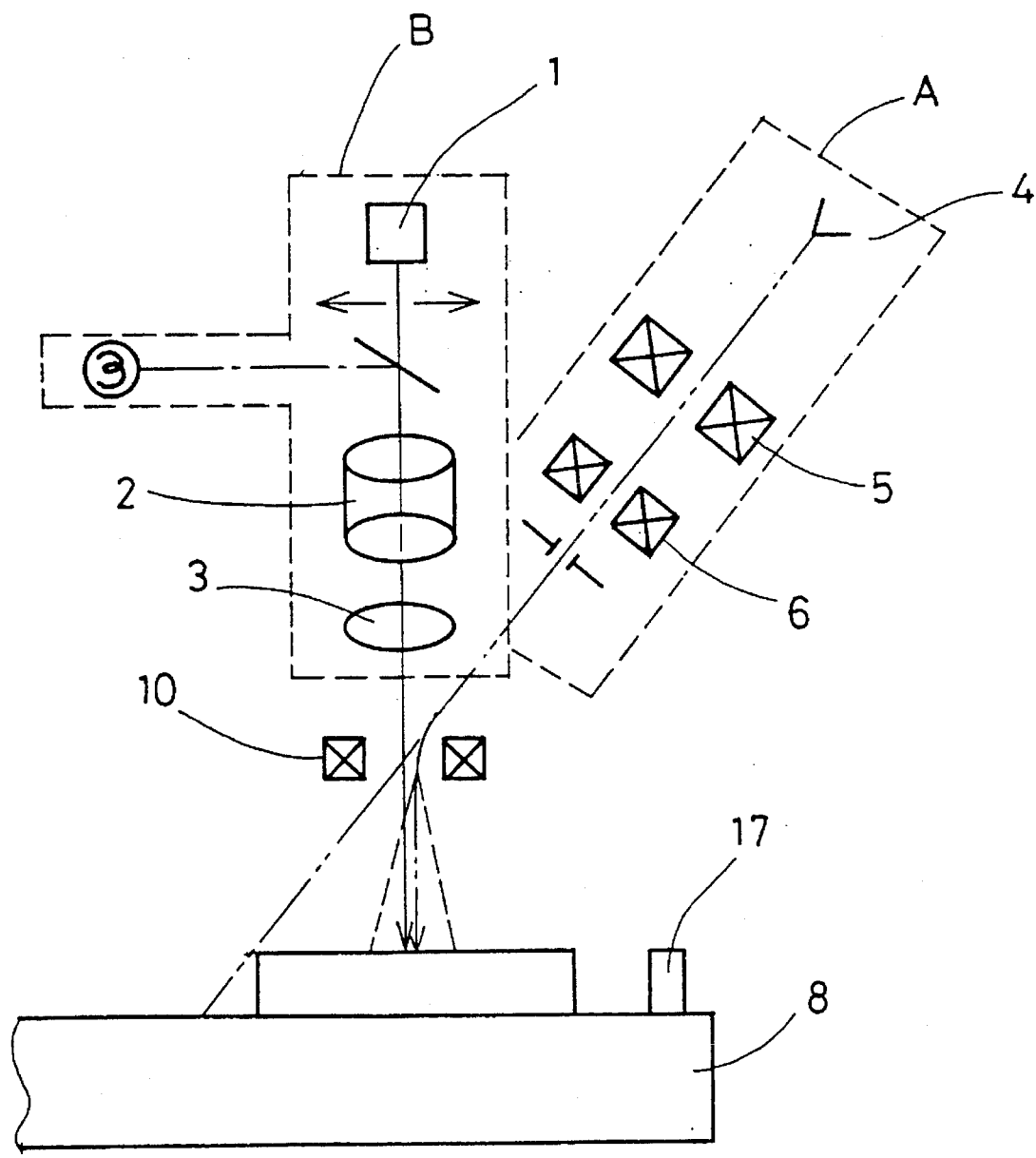
FIG. 3 is a pictorial view of a portion of the embodiment of FIG. 1, illustrating alignment of the electron beam axis and the optical axis according to the invention.

FIG. 3 shows a part of the adjustment means of the embodiment of FIG. 1 for aligning the optical axis and the electron beam axis with one another above stage 8, and shows the relationship between the electron beam irradiation system A, the optical microscope B, and the deflecting coil 10.

While an electron beam current is measured with a Faraday cup 17 provided on the stage 8, the electron beam current is adjusted by acting on the alignment coil 6 so that the current attains a maximum value. Magnification of optical image is minimized by operating the zoom lens 2 and the electric current of the electric lens 5 is adjusted to there minimize the diameter of the electron beam irradiation point on the surface of sample 9.

An electric current is supplied to deflecting coil 10 and is increased to move the electron beam irradiation point to a location corresponding to the vicinity of the center of the display appearing on CRT 16. The current flowing through the deflecting coil 10 is adjusted to an initialization current value (design value). If the electron beam irradiation point drifts away from the center of the display on CRT 16, optical microscope B is moved horizontally, as indicated by the arrows on FIG. 3. These operations are repeated as the magnification produced by lens 2 is increased in increments until the maximum magnification is reached. If the electron beam irradiation point is offset from the center of the display appearing on CRT 16 at the maximum magnification, that irradiation point is adjusted to the center of the display by changing the magnitude of current flow through deflecting coil 10.

Further, the stage 8 is moved up or down in minute increments and the current in deflecting coil 10 is adjusted so that the image of the electron beam irradiation point is centered on the display provided by CRT 16 and does not move wherever the stage 8 is. Finally, the entire optical microscope B is minutely moved to align the optical axis of the optical microscope with the electron beam irradiation point, thereby enabling the electron beam axis and the optical axis to be aligned and concentric with one another.

As explained above, the electron beam irradiation system and the optical microscope are separately assembled and mounted on vacuum chamber 7 and the magnitude of the current applied to electron beam deflecting coil 10 is adjusted while the electron beam axis and the optical axis are simultaneously observed, thereby enabling the electron beam axis and the optical axis to be mutually aligned. In this manner, the present invention can provide an electron beam microanalyzer which has high analytic position accuracy and whose structure can be simplified.

This application relates to subject matter disclosed in Japanese Application number 5-254483, filed on Oct. 12, 1993, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. An electron beam microanalyzer comprising:

an electron beam irradiation device having an electron gun for generating an electron beam to irradiate a sample, and an electron lens for concentrating the electron beam at a surface of the sample;

an optical microscope for observing the sample within a vacuum sample chamber, said microscope having an optical axis; and an energy dispersion type x-ray analyzer for analyzing x-rays generated by irradiating the sample with said electron beam;

wherein said electron beam irradiation device has an electron beam axis which is oblique to the sample surface, and said electron beam microanalyzer further comprises an electron beam deflecting system for deflecting the electron beam from said electron beam irradiation device into an axis which is aligned with the optical axis at the sample surface.

2. An electron beam microanalyzer according to claim 1 wherein said optical axis is perpendicular to the sample surface.

3. An electron beam microanalyzer comprising:

a vacuum chamber;

a sample holder for holding a sample at a sample location in said vacuum chamber;

an optical microscope provided above said sample location for observing the sample, said optical microscope having an optical axis;

an electron beam irradiation device which generates an electron beam along an electron beam axis which is oblique to the optical axis of said optical microscope and passes between said microscope and said sample location; and an electron beam deflecting system located between said microscope and said sample location and surrounding the optical axis, said electron beam deflecting system positioned and operative for deflecting the electron beam from said electron beam irradiation device into an axis which is coincident with the optical axis at the sample location.

4. An electron beam microanalyzer according to claim 3, wherein said electron beam deflecting system comprises an electron beam deflecting coil connected to receive a current which is adjustable for controlling deflection of the electron beam.

5. An electron beam microanalyzer according to claim 4, wherein said optical microscope is movable transversely to said optical axis to bring the optical axis into coincidence with the axis of said electron beam at the sample location.

6. An electron beam microanalyzer according to claim 3, wherein said optical microscope is movable transversely to said optical axis to bring the optical axis into coincidence with the axis of said electron beam at the sample location.

* * * * *